(12) United States Patent
Lam et al.

(10) Patent No.: US 11,443,177 B2
(45) Date of Patent: Sep. 13, 2022

(54) ARTIFICIAL NEUROMORPHIC CIRCUIT AND OPERATION METHOD

(71) Applicants: Jiangsu Advanced Memory Technology Co., Ltd., Jiangsu (CN); ALTO MEMORY TECHNOLOGY CORPORATION, Hsinchu County (TW)

(72) Inventors: Chung-Hon Lam, Hsinchu County (TW); Ching-Sung Chiu, Hsinchu County (TW)

(73) Assignees: JIANGSU ADVANCED MEMORY TECHNOLOGY CO., LTD., Jiangsu (CN); ALTO MEMORY TECHNOLOGY CORPORATION, Hsinchu County (TW)

( * ) Notice: Subject to any disclaimer, the term of this patent is extended or adjusted under 35 U.S.C. 154(b) by 276 days.

(21) Appl. No.: 16/771,225

(22) PCT Filed: Nov. 15, 2019

(86) PCT No.: PCT/CN2019/118798
§ 371 (c)(1),
(2) Date: Jun. 10, 2020

(87) PCT Pub. No.: WO2021/092899
PCT Pub. Date: May 20, 2021

(65) Prior Publication Data
US 2021/0406658 A1    Dec. 30, 2021

(51) Int. Cl.
*G06N 3/063*    (2006.01)
*G06N 3/04*    (2006.01)
(Continued)

(52) U.S. Cl.
CPC ........... *G06N 3/0635* (2013.01); *G06N 3/049* (2013.01); *H03K 5/2463* (2013.01); *H03K 5/2472* (2013.01); *H03K 2005/00156* (2013.01)

(58) Field of Classification Search
CPC ...... G06N 3/0635; G06N 3/049; G06N 3/063; H03K 5/2463; H03K 5/2472; H03K 2005/00156
See application file for complete search history.

(56) References Cited

U.S. PATENT DOCUMENTS 10,318,861 B2    6/2019    Eleftheriou et al.
2010/0299297 A1    11/2010    Breitwisch et al.
(Continued)

FOREIGN PATENT DOCUMENTS

CN    102543172 A    7/2012
CN    102610274 A    7/2012
(Continued)

OTHER PUBLICATIONS

Chung H. Lam, "Neuromorphic Semiconductor Memory", IEEE 2015 International 3D Systems Integration Conference.
(Continued)

*Primary Examiner* — Sung S Ahn
(74) *Attorney, Agent, or Firm* — CKC & Partners Co., LLC

(57) ABSTRACT

Artificial neuromorphic circuit includes synapse circuit and post-neuron circuit. Synapse circuit includes phase change element, first switch, and second switch. Phase change element includes first terminal and second terminal. First switch includes first terminal and second terminal. Second switch includes first terminal, second terminal, and control terminal. First switch is configured to receive first pulse signal. Second switch is coupled to phase change element
(Continued)

and first switch. Second switch is configured to receive second pulse signal. Post-neuron circuit includes capacitor and input terminal. Input terminal of post-neuron circuit charges capacitor in response to first pulse signal. Post-neuron circuit generates firing signal based on voltage level of capacitor and threshold voltage. Post-neuron circuit generates control signal based on firing signal. Control signal controls turning on of second switch. Second pulse signal flows through second switch to control state of phase change element to determine weight of artificial neuromorphic circuit.

10 Claims, 8 Drawing Sheets

(51) Int. Cl.
  *H03K 5/24* (2006.01)
  *H03K 5/00* (2006.01)

(56) References Cited

U.S. PATENT DOCUMENTS

| | | | |
|---|---|---|---|
| 2014/0358834 A1* | 12/2014 | Kim | G11C 11/54 706/25 |
| 2015/0278682 A1 | 10/2015 | Saxena | |
| 2016/0203400 A1 | 7/2016 | Kim et al. | |
| 2016/0203858 A1 | 7/2016 | Kim et al. | |
| 2016/0350643 A1 | 12/2016 | Hosokawa et al. | |
| 2016/0350647 A1 | 12/2016 | Hosokawa et al. | |
| 2016/0371583 A1 | 12/2016 | Hosokawa et al. | |
| 2017/0364801 A1* | 12/2017 | Kim | G06N 3/0635 |
| 2019/0065929 A1 | 2/2019 | Koelmans et al. | |

FOREIGN PATENT DOCUMENTS

| | | |
|---|---|---|
| CN | 102667826 A | 9/2012 |
| CN | 106447033 A | 2/2017 |
| CN | 106470023 A | 3/2017 |
| CN | 106796669 A | 5/2017 |
| CN | 106815636 A | 6/2017 |
| CN | 106934457 A | 7/2017 |
| CN | 107111783 A | 8/2017 |
| CN | 107615307 A | 1/2018 |
| CN | 108780520 A | 11/2018 |
| CN | 108921290 A | 11/2018 |
| CN | 109255435 A | 1/2019 |
| CN | 109727678 A | 5/2019 |
| CN | 110188873 A | 8/2019 |

OTHER PUBLICATIONS

S. Kim et al., "NVM Neuromorphic Core with 64k-cell (256-by-256) Phase Change Memory Synaptic Array with On-Chip Neuron Circuits for Continuous In-Situ Learning", 2015 IEEE International Electron Devices Meeting (IEDM), 4 pages.

* cited by examiner

ARTIFICIAL NEUROMORPHIC CIRCUIT AND OPERATION METHOD

RELATED APPLICATIONS

This application is a U.S. National Phase application of PCT/CN2019/118798 filed Nov. 15, 2019, which is herein incorporated by reference.

BACKGROUND

Field of Invention

The present disclosure relates to a circuit technology. More particularly, the present disclosure relates to an artificial neuromorphic circuit and an operation method.

Description of Related Art

A living body has a neural network system. The neural network system contains many neurons. Neurons were proposed by Heinrich Wilhelm Gottfried von Waldeyer-Hartz in 1891. Neurons are processing units that obtain discrete information from the brain. In 1897, Charles Sherrington called the junction between two neurons a "synapse." The discrete information from the brain flows through the synapse along one direction, and the neurons are divided into a "presynaptic neuron" and a "postsynaptic neuron" according to this direction. A neuron emits a "spike" when receiving enough input and being activated.

Theoretically, the captured experience is translated into synaptic conductance in the brain. The synaptic conductance changes over time based on the relative spike times of the presynaptic neuron and the postsynaptic neuron. If the postsynaptic neuron fires before the presynaptic neuron fires, the synaptic conductance will increase. If the two fire in reverse order, the synaptic conductance will decrease. In addition, this change depends on the delay between the two events. The longer the delay, the smaller the change is.

An artificial neural network allows an electronic system to operate in a manner similar to a biological brain. A neuron system may include various electronic circuits that model biological neurons.

A neural network system affects the perception, selection, decision, or various other behaviors of the living body, so the neural network system plays a very important role in the living body. If circuits can be utilized to build neural network systems similar to those in the living bodies, they will have key influences on many areas.

For example, U.S. Pat. No. 9,830,981 or Chinese Patent No. 107111783 mentions that a phase change element and some other elements can be utilized to construct an artificial neural network system.

SUMMARY

An artificial neuromorphic circuit is provided. The artificial neuromorphic circuit comprises a synapse circuit and a post-neuron circuit. The synapse circuit comprises a phase change element, a first switch, and a second switch. The phase change element comprises a first terminal and a second terminal. The first switch comprises a first terminal and a second terminal. The second switch comprises a first terminal, a second terminal, and a control terminal. The first switch is configured to receive a first pulse signal. The second switch is coupled to the phase change element and the first switch. The second switch is configured to receive a second pulse signal. The post-neuron circuit comprises a capacitor and an input terminal. The input terminal of the post-neuron circuit charges the capacitor in response to the first pulse signal. The post-neuron circuit generates a firing signal based on a voltage level of the capacitor and a threshold voltage. The post-neuron circuit generates a control signal based on the firing signal. The control signal controls turning on of the second switch. The second pulse signal flows through the second switch to control a state of the phase change element so as to determine a weight of the artificial neuromorphic circuit.

In some embodiments, the first terminal of the first switch is configured to receive the first pulse signal, the first terminal of the second switch is configured to receive the second pulse signal, and the second terminal of the first switch and the second terminal of the second switch are coupled to the first terminal of the phase change element. The second terminal of the phase change element is coupled to the input terminal of the post-neuron circuit, and the control terminal of the second switch is configured to receive the control signal of the post-neuron circuit.

In some embodiments, the first switch is a diode.

In some embodiments, the post-neuron circuit comprises a comparator, a delay circuit, and a pulse generator. The comparator is configured to compare the voltage level of the capacitor and the threshold voltage to generate the firing signal. The delay circuit is configured to delay the firing signal. The pulse generator is configured to generate the control signal according to the delayed firing signal.

The present disclosure provides an operation method of an artificial neuromorphic circuit. The operation method comprises: providing a synapse circuit, wherein the synapse circuit comprises a first switch, a second switch, and a phase change element, the first switch comprises a first terminal and a second terminal, the second switch comprises a first terminal, a second terminal, and a control terminal, and the phase change element comprises a first terminal and a second terminal; providing a post-neuron circuit, wherein the post-neuron circuit comprises an input terminal and a capacitor; receiving a first pulse signal by using the first switch of the synapse circuit; receiving a second pulse signal by using the second switch of the synapse circuit; charging the capacitor through the input terminal by the post-neuron circuit in response to the first pulse signal; generating a firing signal based on a voltage level of the capacitor and a threshold voltage by using the post-neuron circuit; generating a control signal based on the firing signal by using the post-neuron circuit; and controlling a current of the second switch of the synapse circuit based on the control signal and the second pulse signal to control a state of the phase change element of the synapse circuit so as to determine a weight of the artificial neuromorphic circuit.

In some embodiments, the operation method further comprises: receiving the first pulse signal by using the first terminal of the first switch; receiving the second pulse signal by using the first terminal of the second switch, wherein the second terminal of the first switch and the second terminal of the second switch are coupled to the first terminal of the phase change element; and receiving the control signal by using the control terminal of the second switch.

In some embodiments, the first switch is a diode, and the second switch is a transistor.

In some embodiments, the second terminal of the phase change element is coupled to the input terminal of the post-neuron circuit.

In some embodiments, the operation method further comprises: comparing the voltage level of the capacitor and the threshold voltage by using a comparator of the post-neuron circuit to generate the firing signal.

In some embodiments, the operation method further comprises: delaying the firing signal by using a delay circuit of the post-neuron circuit; and generating the control signal according to the delayed firing signal by using a pulse generator of the post-neuron circuit.

In summary, the artificial neuromorphic circuit and operation method of the present disclosure can utilize circuits to build an artificial neural network system.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

In this document, the term "coupled" may also be termed "electrically coupled," and the term "connected" may be termed "electrically connected." "Coupled" and "connected" may also be used to indicate that two or more elements cooperate or interact with each other.

Figure 1:
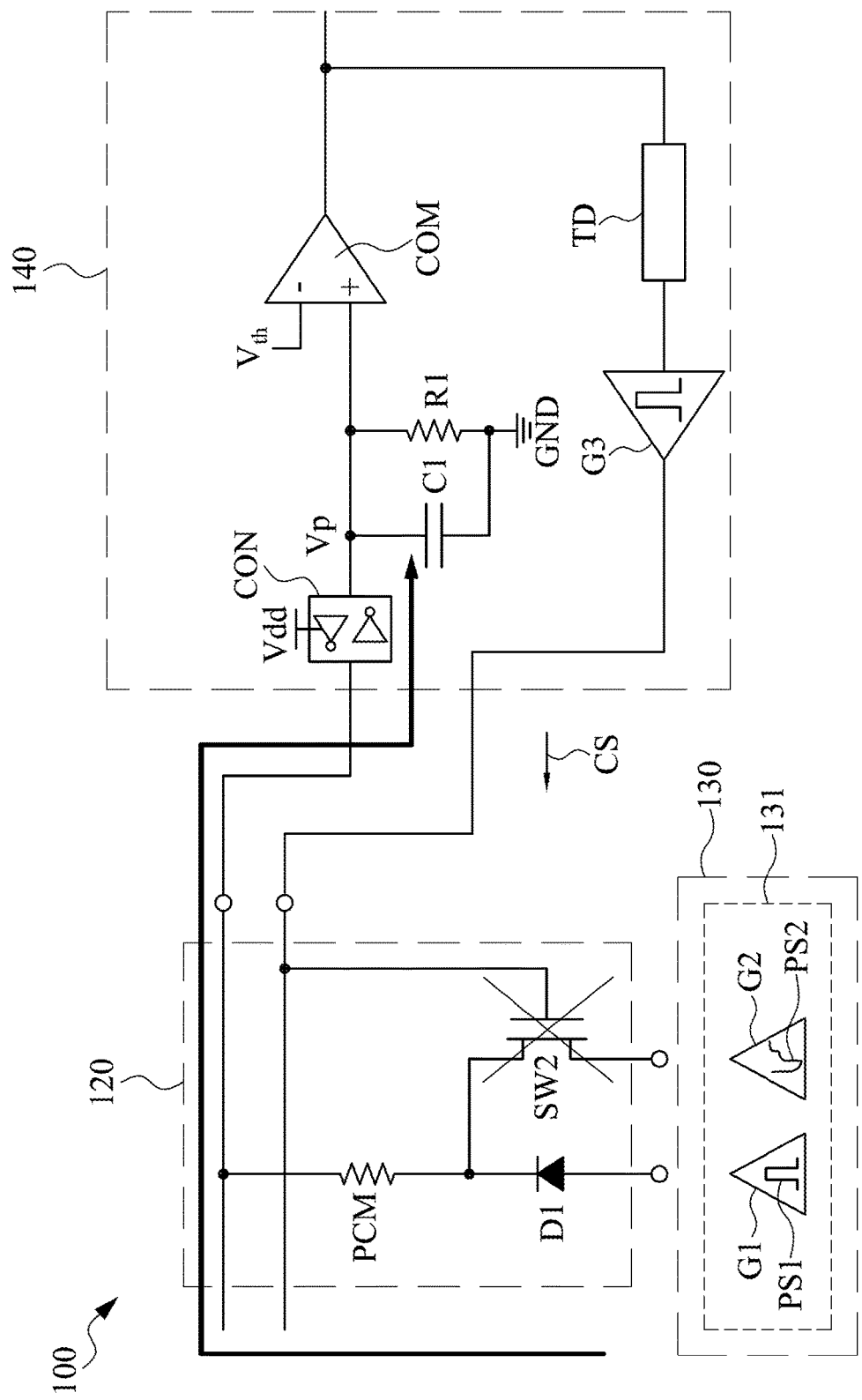
FIG. 1 depicts a schematic diagram of an artificial neuromorphic circuit according to some embodiments of the present disclosure.
Figure 2:
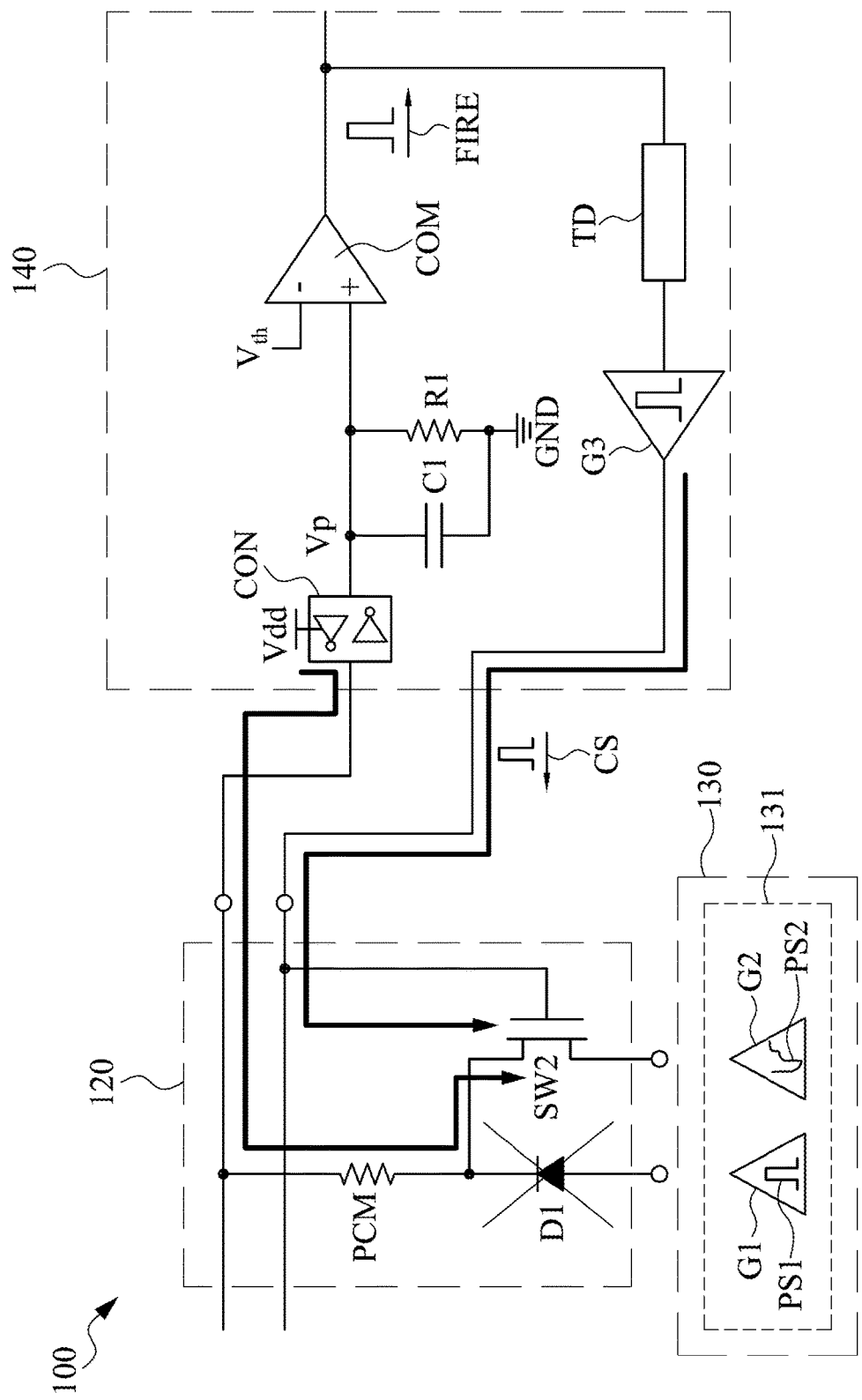
FIG. 2 depicts a schematic diagram of an artificial neuromorphic circuit according to some embodiments of the present disclosure.

A description is provided with reference to FIG. 1 and FIG. 2. FIG. 1 and FIG. 2 depict schematic diagrams of an artificial neuromorphic circuit 100 according to some embodiments of the present disclosure.

As for the example shown in FIG. 1, the artificial neuromorphic circuit 100 includes a synapse circuit 120, a pre-synaptic neuron circuit 130 (hereinafter referred to as "pre-neuron" 130), and a post-synaptic neuron circuit 140 (hereinafter referred to as "post-neuron" 140). The pre-neuron 130 includes an axon driver 131. The axon driver 131 includes a pulse generator G1 and a pulse generator G2. The post-neuron 140 includes dendrites configured to receive a signal. In some embodiments, the axon driver 131 of the pre-neuron 130 sends a spike, which is transmitted to the dendrites of the post-neuron 140 via the synapse circuit 120 to stimulate the post-neuron 140. In this manner, an effect similar to signal transmission in the neural network system is achieved.

The synapse circuit 120 includes a phase change element PCM, a switch D1, and a switch SW2. The phase change element PCM includes a phase change material. The phase change material has different crystalline phases based on a magnitude of a current pulse and/or a duration of a pulse. Different crystalline phases have different physical properties. For example, a crystalline phase or a polycrystalline phase has a low resistance value, while an amorphous phase has a high resistance value. Accordingly, information can be stored in the crystalline phase correspondingly.

The switch D1 is implemented by using a diode. The switch SW2 is implemented by using a transistor. In greater detail, the switch D1 includes a first terminal and a second terminal. The first terminal is an anode terminal and the second terminal is a cathode terminal. The first terminal of the switch D1 is coupled to the pulse generator G1 to receive a pulse signal PS1. A first terminal of the switch SW2 is coupled to the pulse generator G2 to receive a pulse signal PS2. The second terminal of the switch D1 and a second terminal of the switch SW2 are coupled to a first terminal of the phase change element PCM. A second terminal of the phase change element PCM is coupled to the post-neuron 140. A control terminal of the switch SW2 is coupled to the post-neuron 140 so as to receive a control signal CS from the post-neuron 140.

The post-neuron 140 includes a control circuit CON, a capacitor C1, a resistor R1, a comparator COM, a delay circuit TD, and a pulse generator G3. First terminals of the capacitor C1 and the resistor R1 are coupled to a ground terminal GND. The control circuit CON can control a signal path input to or output from the post-neuron 140. The comparator COM includes a positive input terminal, a negative input terminal, and an output terminal. The second terminal of the phase change element PCM, a second terminal of the capacitor C1, and a second terminal of the resistor R1 are coupled to the positive input terminal of the comparator COM. The negative input terminal of the comparator COM is configured to receive a threshold voltage $V_{th}$. The output terminal of the comparator COM is coupled to the delay circuit TD. The delay circuit TD is coupled to the pulse generator G3. The pulse generator G3 is coupled to the control terminal of the switch SW2.

The capacitor C1 in the post-neuron 140 simulates an electrical potential of a neuron membrane. There are a variety of charged ions inside and outside the neuron membrane. Due to the differences in the type and charge quantity of the charged ions inside and outside the cell membrane, the capacitor C1 reflects a voltage difference (also called membrane potential) inside and outside the cell membrane (hereinafter referred to as the voltage level Vp). The neuron membrane has channels that are of different sizes and can control the passage of the charged ions. The charged ions inside and outside the cell membrane can pass these channels to cause a change of the voltage level Vp. The resistor R1 simulates the electrical effect of the passage of charged ions back and forth through the channels. The pulse signal sent from the axon of the pre-neuron is received by the dendrites of the post-neuron to change the membrane potential of the post-neuron membrane (the voltage level Vp). The behavioral effect corresponding to the post-neuron 140 is to charge the capacitor C1. If an intensity of the above pulse signal is strong enough, the post-neuron 140 will output a firing signal (FIRE) when the membrane potential (the voltage level Vp) of the capacitor C1 exceeds the threshold voltage $V_{th}$. On the contrary, if the intensity of the pulse signal is not strong enough, the post-neuron 140 will not output the firing signal (FIRE) although a voltage on the capacitor C1 rises but, however, does not exceed the threshold voltage $V_{th}$. In addition, the increased membrane potential (the voltage level Vp) will gradually decrease through a leakage of the resistor R1. The behavior on the neuron is that the post-neuron instantly changes the concentrations of charged ions inside and outside the cell membrane due to the firing signal of the pre-neuron, and then the charged ions are balanced by diffusion through the channels on the cell membrane, so that the membrane potential of the post-neuron membrane (the voltage level Vp) returns to equilibrium. Accordingly, the electrical behavior of the path that the pre-neuron 130 sends the pulse signal to the capacitor C1 of the post-neuron 140 is called leaky integration and fire (LIF). The membrane potential (the voltage level Vp) of the neuron is a function of LIF (Vp=F (LIF)).

The firing signal of the pre-neuron affects the membrane potential of the post-neuron via the synapse (including the axon of the pre-neuron and the dendrites of the post-neuron). However, even with the same firing signal, different pre-neurons have different magnitudes of effects on the membrane potential of the post-neuron. It can be said that a magnitude of a synaptic weight (W) between the pre-neuron and the post-neuron is different. Synaptic weight (W) is plastic (or called adaptable). A magnitude of weight change (ΔW) is a function of a time difference between the pre-neuron firing time (t1) and the post-neuron firing time (t2) (ΔW=F (t2−t1). In other words, the magnitude of the change of the synaptic weight (ΔW) is related to the time difference between the firing time t1 and the firing time t2, and the synaptic weight W is adaptively adjusted according to the value of the time difference. Therefore, the synaptic weight (W) relates to the index of causality between neurons. In this manner, a characteristic index representing that the synapse changes the weight (W) due to the relative relationship between the pre-neuron firing time and the post-neuron firing time is defined, which is called spike timing dependent plasticity (STDP). The STDP of the synapse is also indirectly related to LIF. This is because LIF can determine the post-neuron firing time (t2). In some embodiments, the STDP of the synapse represents the plasticity of the conductivity of synaptic current. In greater detail, the STDP of the synapse represents a magnitude of a synaptic resistance in some embodiments.

Figure 3:
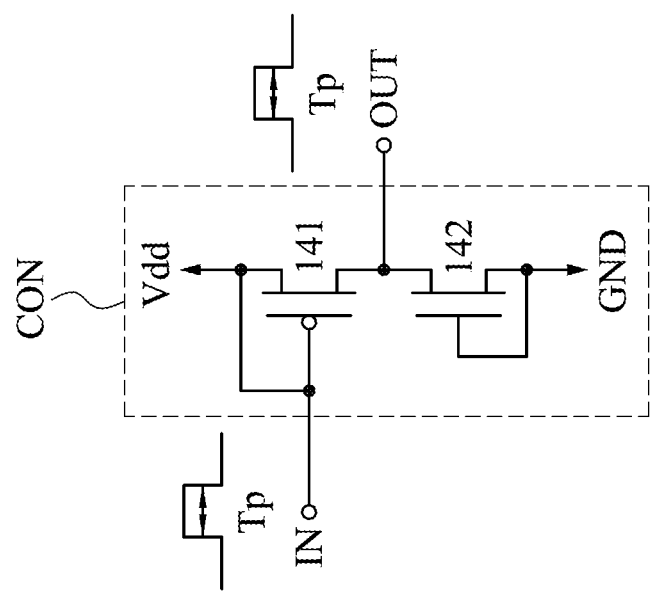
FIG. 3 depicts a schematic diagram of a control circuit according to some embodiments of the present disclosure.

A description is provided with reference to FIG. 3. FIG. 3 depicts a schematic diagram of a control circuit CON in the post-neuron 140 according to some embodiments of the present disclosure. Take the example shown in FIG. 3 as an example, the control circuit CON includes a control circuit input terminal IN, a control circuit output terminal OUT, a transistor 141, and a transistor 142. Each of the transistors 141, 142 includes a first terminal (for example: a gate), a second terminal (for example: a source), and a third terminal (for example: a drain). The two transistor 141, 142 are connected in series. In a normal state, both the transistors 141 and 142 are not turned on. The control circuit input terminal IN is electrically connected to a power supply Vdd, and the control circuit output terminal OUT is in a floating state. When the gate of the transistor 141 receives a pulse voltage/current having a pulse time Tp, the transistor 141 is turned on and the control circuit output terminal OUT outputs a pulse voltage/current having the same pulse time Tp. After a pulse of the control circuit input terminal IN ends, the transistor 141 is turned off and the control circuit output terminal OUT returns to the floating state.

In some embodiments, the transistor 141 is a P-type metal-oxide-semiconductor (PMOS) field effect transistor. The gate and the source of the transistor 141 are electrically connected and are electrically connected to the power supply Vdd. The control circuit input terminal IN is electrically connected to the gate of the transistor 141. The transistor 142 is an N-type metal-oxide-semiconductor (NMOS) field effect transistor. The gate and the source of the transistor 142 are electrically connected and are electrically connected to the ground terminal GND. The drain of the transistor 141 and the drain of the transistor 142 are connected together to the control circuit output terminal OUT.

Figure 4:
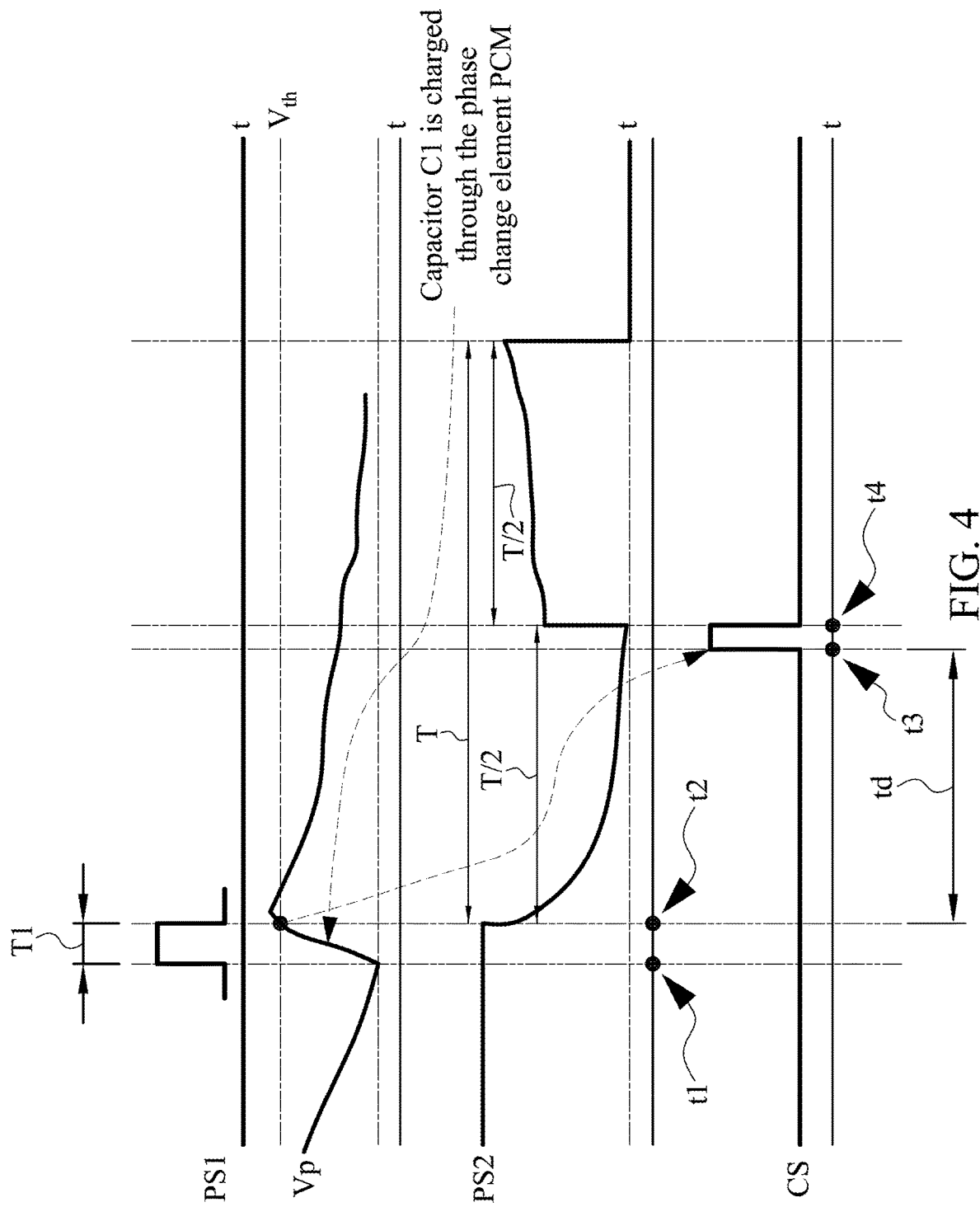
FIG. 4 depicts a waveform diagram of signals of an artificial neuromorphic circuit according to some embodiments of the present disclosure.

FIG. 4 depicts a waveform diagram of signals of an artificial neuromorphic circuit according to some embodiments of the present disclosure.

A description is provided with reference to FIG. 1 and FIG. 4. Before the pre-neuron 130 sends the spike, the voltage level Vp of the capacitor C1 in the post-neuron 140 gradually moves toward an equilibrium potential via the resistor R1. In some embodiments, the equilibrium potential is a ground potential. However, the present disclosure is not limited in this regard. The pulse generator G1 in the axon driver 131 sends the pulse signal PS1 at time t1, and a pulse time period T1 of the pulse signal PS1 is from time t1 to time t2. During the pulse time period T1, the switch D1 is turned on and the switch SW2 is turned off. In some embodiments, the pulse signal PS1 is also called "axon pulse LIF", and its pulse time period is 100 nanoseconds (ns). However, the present disclosure is not limited in this regard. In a path where the pulse signal PS1 (the axon pulse LIF) is input to the post-neuron 140 via the control circuit CON, the pulse signal PS1 (the axon pulse LIF) passes the phase change element PCM of the synapse circuit 120 to charge the second terminal of the capacitor C1 (the positive input terminal of the comparator COM). If the voltage level Vp of the capacitor C1 is higher than the threshold voltage $V_{th}$ of the negative input terminal of the comparator COM before time t2 (including the point t2), the output terminal of the comparator COM immediately sends the firing signal FIRE at this time. Accordingly, a magnitude of a resistance value of the phase change element PCM can control the speed of charging the capacitor C1.

After that, a description is provided with reference to FIG. 2 and FIG. 4. At time t2, the pulse generator G2 of the axon driver 131 generates the pulse signal PS2. In some embodiments, the pulse signal PS2 is also called "axon pulse STDP". In some embodiments, a pulse time period T of the pulse signal PS2 (the axon pulse STDP) is 100 milliseconds (ms). However, the present disclosure is not limited in this regard. The pulse time period T of the pulse signal PS2 (the axon pulse STDP) is divided into two time zones with equal time duration (T/2), front and rear. The pulse in the front time zone (T/2) is gradually decreased from a high voltage. The pulse in the back time zone (T/2) is instantly increased by a voltage value (not marked), and is then gradually increased. After the pulse signal PS1 (the axon pulse LIF) ends, a voltage of the capacitor C1 in the post-neuron 140 will be gradually discharged through the resistor R1 and returns to the equilibrium value of the cell membrane potential.

The firing signal FIRE sent by the output terminal of the comparator COM goes through the delay circuit TD and the pulse generator G3 to output the control signal CS so as to turn on the switch SW2. The delay circuit TD will add a delay time td to the firing signal FIRE. In some embodiments, the delay time td is 50 ms. After the above-mentioned delay time td, the control signal CS is sent to a gate of the switch SW2 at time t3 to turn on the switch SW2. A pulse time period of the control signal CS is from time t3 to time t4. The control signal CS can turn on the switch SW2 during the pulse time period. In some embodiments, time t3 to the time t4 is 0.1 ms.

During a turn-on time of the switch SW2, the switch D1 is in a turn-off state. The control circuit CON will allow a current to flow through the phase change element PCM and the switch SW2 from the power supply Vdd. At this time, a magnitude of a voltage difference across the first terminal and the second terminal of the switch SW2 can adjust a magnitude of the current flowing through the switch SW2.

In some embodiments, a pulse interval of the control signal CS falls into the front time zone of the pulse signal PS2 (the axon pulse STDP). At this time, the voltage difference across the two terminals of the switch SW2 is larger. Accordingly, a larger current flows through the switch SW2 instantaneously. Therefore, the current that instantaneously flows through the phase change element PCM is larger, and the PCM is more likely to be formed an amorphous state. As a result, the resistance value is higher. In some embodiments, the pulse interval of the control signal CS falls into the back time zone of the pulse signal PS2 (the axon pulse STDP). At this time, the voltage difference across the two terminals of the switch SW2 is smaller. Accordingly, a smaller current flows through the switch SW2 instantaneously. Therefore, the current that instantaneously flows through the phase change element PCM is smaller, and the PCM is formed a crystalline state or a polycrystalline state. As a result, the resistance value is lower. Because the voltage values of the pulse signal PS2 (the axon pulse STDP) in the front and back time zones are not fixed values, the voltage difference across the two terminals of the switch SW2 shows a continuous difference in magnitude. As a result, the current flowing through the phase change element PCM will also show a continuous change in magnitude.

Based on the above descriptions, the degree of conduction of the switch SW2 will affect a magnitude of current flowing through the phase change element PCM, and the phase of the phase change element PCM will be changed according to the magnitude of current flowing through the phase change element PCM. The phase of the phase change element PCM can be used to determine a weight of the artificial neuromorphic circuit 100, and the weight is used to reflect the degree of influence of the pre-neuron on the post-neuron. For example, the more the pre-neuron stimulates the post-neurons, the higher the weight of the artificial neuromorphic circuit 100 is.

In some embodiments, the pulse time period of the pulse signal PS1 (the axon pulse LIF) is 0.1 ms. The pulse time period of the pulse signal PS2 (the axon pulse STDP) is 100 ms. The delay time td of the delay circuit TD is 50 ms. After the above delay time td, the control signal CS output at time t3 is close to a middle point of a time interval of the pulse signal PS2 (the axon pulse STDP). Therefore, if the control signal CS of the post-neuron 140 is caused by the firing of the pre-neuron 130, a time point of the control signal CS is more likely to fall into the back time zone of the pulse signal PS2 (the axon pulse STDP). As a result, the phase change element PCM in the synapse circuit 120 will be set to have a low resistance value correspondingly, which indicates that the corresponding synapse circuit 120 has better conductivity, that is, the firing of the post-neuron 140 (the firing signal FIRE) has a higher causal relationship with the firing of the pre-neuron 130. Hence, the weight (W) of the synaptic circuit 120 is increased.

In some other embodiments, if the firing of the post-neuron 140 (the firing signal FIRE) is directly caused by the firing of another pre-neuron (not shown in the figure), the control signal CS is more likely to fall into the front time zone of the pulse signal PS2 (the axon pulse STDP). As a result, the phase change element PCM in the synapse circuit 120 corresponding to the pre-neuron 130 will be set to have a high resistance value, which indicates that the firing of the post-neuron 140 (the firing signal FIRE) has a lower causal relationship with the firing of the pre-neuron 130. Hence, the weight (W) of the synaptic circuit 120 is decreased.

The artificial neuromorphic circuit 100 can utilize the above-mentioned operations to learn behaviors so as to realize the neural network system similar to that in a living body.

Figure 5:
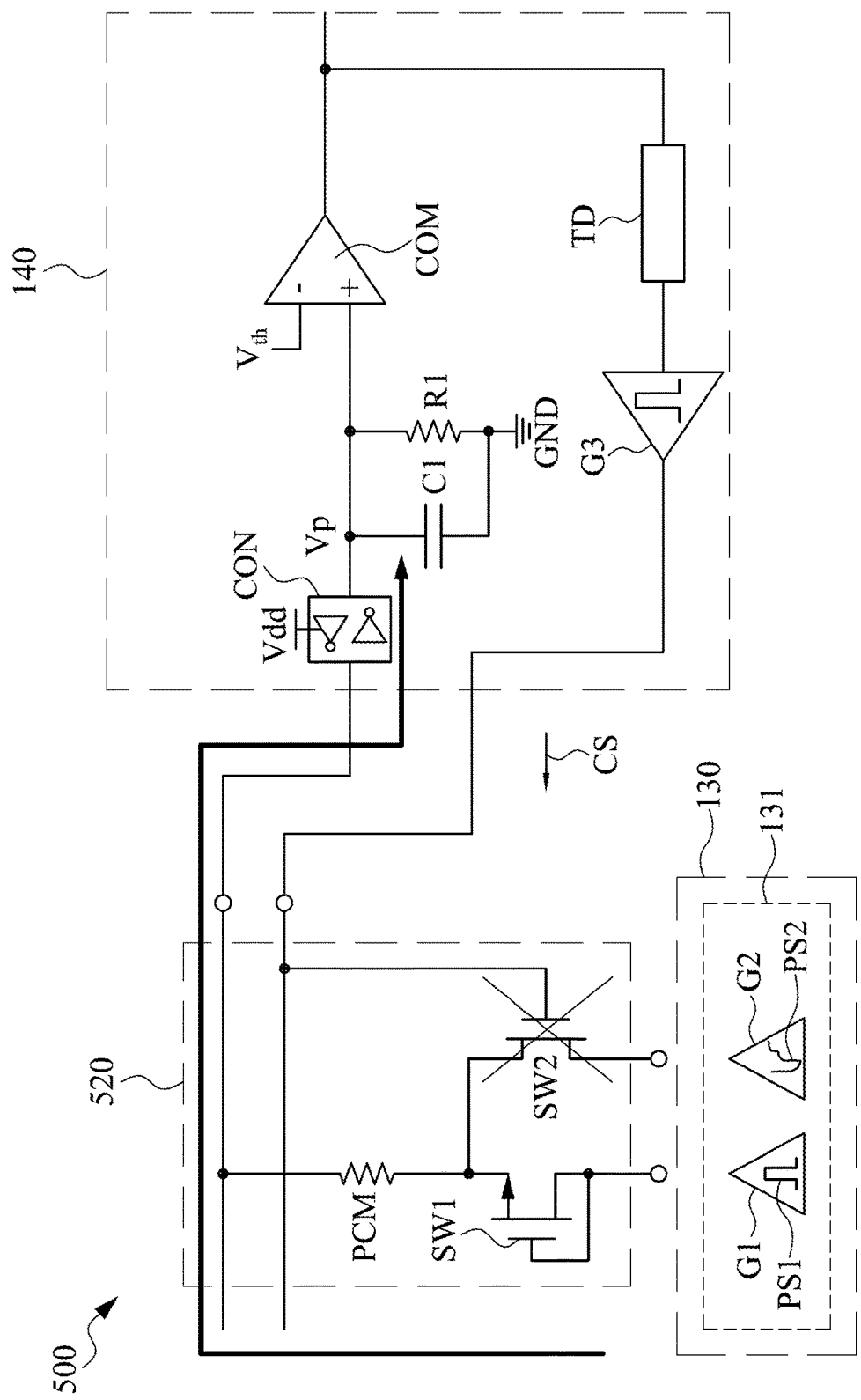
FIG. 5 depicts a schematic diagram of an artificial neuromorphic circuit according to some embodiments of the present disclosure.

A description is provided with reference to FIG. 5. FIG. 5 depicts a schematic diagram of an artificial neuromorphic circuit 500 according to some embodiments of the present disclosure. The artificial neuromorphic circuit 500 of FIG. 5 differs from the artificial neuromorphic circuit 100 of FIG. 1 in that the switch D1 in the artificial neuromorphic circuit 100 is replaced by a switch SW1 in a synapse circuit 520 of the artificial neuromorphic circuit 500. In FIG. 5, the switch SW1 is an N-type metal-oxide-semiconductor field effect transistor.

Take the example shown in FIG. 5 as an example, the switch SW1 includes at least three terminals (a first terminal, a second terminal, and a control terminal). The first terminal is a source terminal, the second terminal is a drain terminal, and the control terminal is a gate terminal. The first terminal of the switch SW1 is coupled to the pulse generator G1 to receive the pulse signal PS1. The second terminal of the switch SW1 is coupled to the phase change element PCM. The control terminal of the switch SW1 is coupled to the first terminal of the switch SW1.

Since the connection relationships and operations of the other components of the artificial neuromorphic circuit 500 are similar to those of the artificial neuromorphic circuit 100 of FIG. 1, a description in this regard is not provided.

Figure 6:
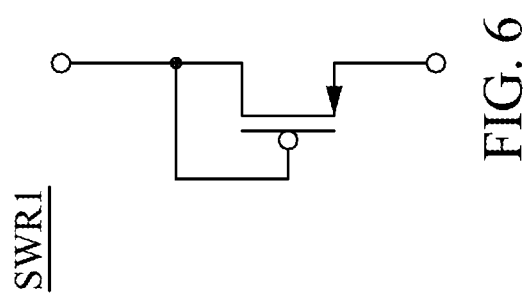
FIG. 6 depicts a schematic diagram of a switch.

A description is provided with reference to FIG. 6. FIG. 6 is a schematic diagram of a switch SWR1. Take the example shown in FIG. 6 as an example, the switch SWR1 is a P-type metal-oxide-semiconductor field effect transistor, and a control terminal of the switch SWR1 is coupled to a second terminal of the switch SWR1. In some embodiments, the switch SWR1 can be used to replace the switch SW1 in FIG. 5 so as to complete the similar operation.

Figure 7:
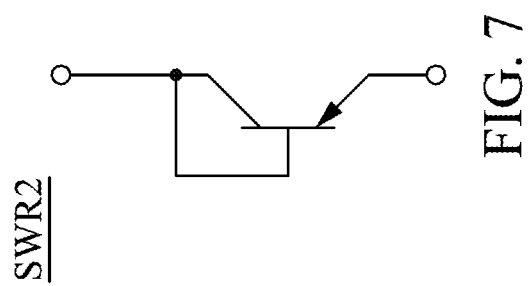
FIG. 7 depicts a schematic diagram of another switch.

A description is provided with reference to FIG. 7. FIG. 7 is a schematic diagram of a switch SWR2. Take the example shown in FIG. 7 as an example, the switch SWR2 is a bipolar transistor. In some embodiments, the switch SWR2 can be used to replace the switch SW1 in FIG. 5 so as to complete the similar operation.

Figure 8B:
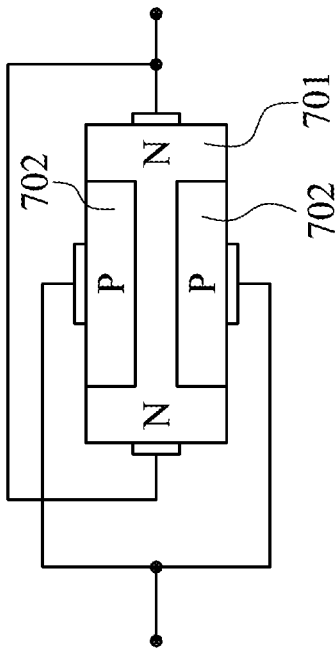
FIG. 8B depicts a schematic diagram of a structure of the switch in FIG. 8A.
Figure 8A:
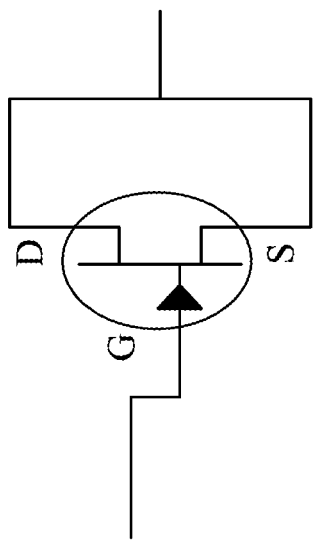
FIG. 8A depicts a schematic diagram of still another switch.

A description is provided with reference to FIG. 8A and FIG. 8B. FIG. 8A is a schematic diagram of a switch SWR3. FIG. 8B is a schematic diagram of a structure of the switch SWR3 in FIG. 8A. The switch SW3 is a junction field effect transistor. In some embodiments, the switch SWR3 can be used to replace the switch D1 in FIG. 1 so as to complete the similar operation. A first area (N-type area) 701 can be used as a cathode terminal, and a second area (P-type area) 702 can be used as an anode terminal.

Figure 9:
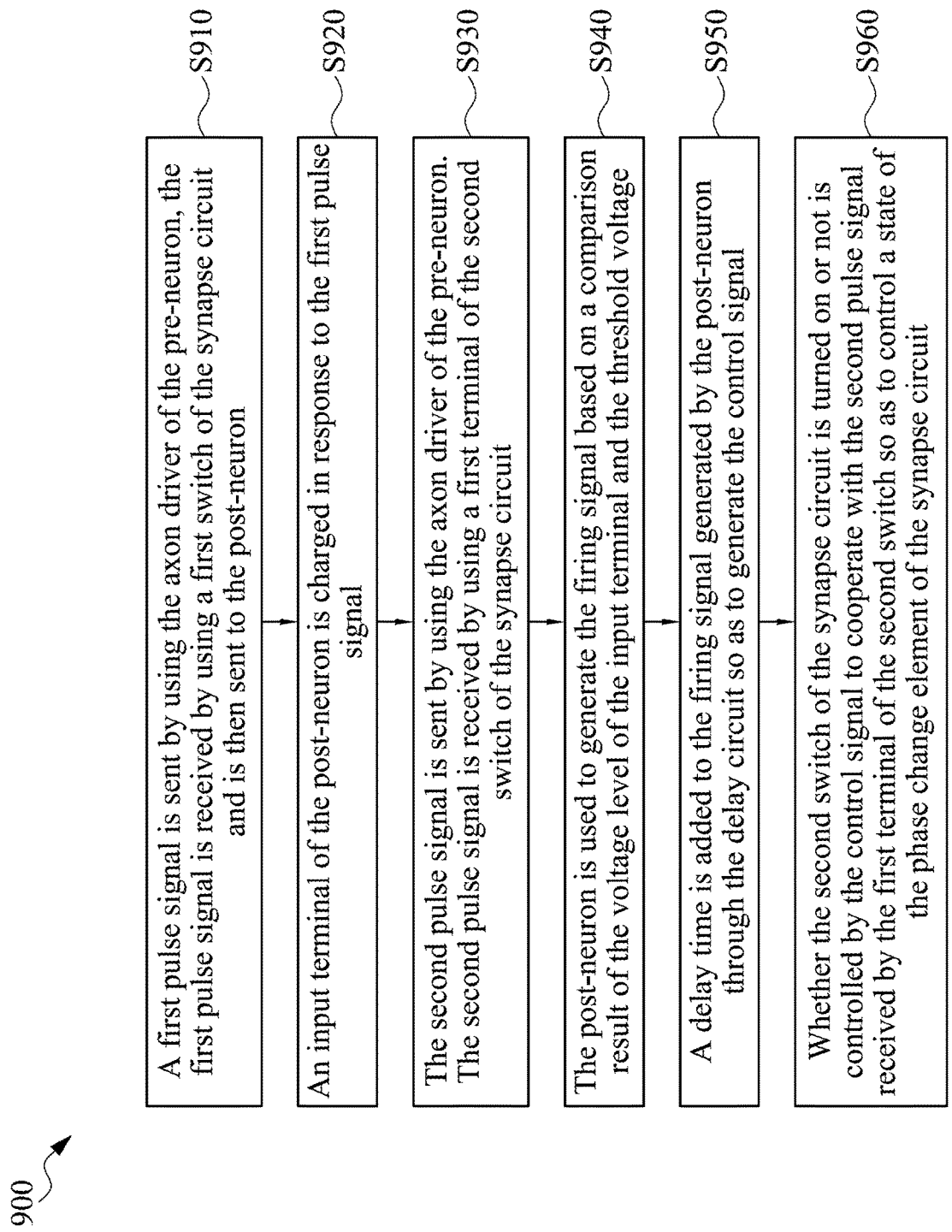
FIG. 9 depicts a flowchart of an operation method of an artificial neuromorphic circuit according to some embodiments of the present disclosure.

A description is provided with reference to FIG. 9. FIG. 9 depicts a flowchart of an operation method 900 of an artificial neuromorphic circuit according to some embodiments of the present disclosure. Take the example shown in FIG. 9 as an example, the operation method 900 includes an operation S910, an operation S920, an operation S930, an operation S940, an operation S950, and an operation S960. In some embodiments, the operation method 900 is applied to the artificial neuromorphic circuit 100 of FIG. 1, but the present disclosure is not limited in this regard. To facilitate understanding, a discussion is provided with reference to FIG. 1 as follows.

The pre-neuron 130 plays the role of, for example, an axon. In operation S910, the pre-neuron 130 sends a spike by using the axon driver 131, the spike is received by the synapse circuit 120 and is then sent to the post-neuron 140. In some embodiments, the pulse signal PS1 is sent by using the axon of the pre-neuron 130. The pulse signal PS1 is received by the first switch D1 of the synapse circuit 120 and is sent to the post-neuron 140.

In operation S920, an input terminal of the post-neuron 140 (the comparator COM) is charged in response to the pulse signal PS1. In some embodiments, the post-neuron 140 plays the role of, for example, dendrites to receive a signal from the synapse circuit 120.

In operation S930, the pulse signal PS2 is sent by using the axon driver 131 of the pre-neuron 130. The pulse signal PS2 is received by using a first terminal of the switch SW2 of the synapse circuit 120.

In operation S940, the post-neuron 140 is used to generate the firing signal FIRE based on a comparison result of the voltage level Vp of the input terminal and the threshold voltage $V_{th}$. In some embodiments, the comparator COM outputs the firing signal FIRE when the voltage level Vp is higher than the threshold voltage $V_{th}$.

In operation S950, the post-neuron 140 is used to generate the control signal CS based on the firing signal FIRE. In some embodiments, the delay circuit TD will add a delay time to the firing signal FIRE to generate the control signal CS.

In operation S960, whether the switch SW2 of the synapse circuit 120 is turned on or not is controlled according to the control signal, and that cooperate with the second pulse signal PS2, which is received by the first terminal of the switch SW2, so as to control a state of the phase change element PCM of the synapse circuit 120. Accordingly, a weight of the artificial neuromorphic circuit 100 can be determined according to the state of the phase change element PCM. In some embodiments, the phase change element PCM includes a phase change material. Different phases of the phase change material correspond to different resistance values.

The above description of the operation method 900 includes exemplary operations, but the operations of the operation method 900 are not limited to the order shown. The order of the operations of the operation method 900 may be changed, or the operations may be performed simultaneously, partially simultaneously, or partially omitted under appropriate circumstances, which are all within the spirit and scope of the embodiments of the present disclosure.

In summary, the artificial neuromorphic circuit and operation method of the present disclosure can utilize circuits to build an artificial neural network system.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An artificial neuromorphic circuit comprising:
    a synapse circuit comprising:
        a phase change element comprising a first terminal and a second terminal;
        a first switch comprising a first terminal and a second terminal, the first switch being configured to receive a first pulse signal; and
        a second switch comprising a first terminal, a second terminal, and a control terminal, the second switch being coupled to the phase change element and the first switch, the second switch being configured to receive a second pulse signal; and
    a post-neuron circuit comprising a capacitor and an input terminal, the input terminal of the post-neuron circuit charging the capacitor in response to the first pulse signal, the post-neuron circuit generating a firing signal based on a voltage level of the capacitor and a threshold voltage, and the post-neuron circuit generating a control signal based on the firing signal;
    wherein the control signal controls turning on the second switch, the second pulse signal flows through the second switch to control a state of the phase change element so as to determine a weight of the artificial neuromorphic circuit.

2. The artificial neuromorphic circuit of claim 1, wherein the first terminal of the first switch is configured to receive the first pulse signal, the first terminal of the second switch is configured to receive the second pulse signal, and the second terminal of the first switch and the second terminal of the second switch are coupled to the first terminal of the phase change element, the second terminal of the phase change element is coupled to the input terminal of the post-neuron circuit, and the control terminal of the second switch is configured to receive the control signal of the post-neuron circuit.

3. The artificial neuromorphic circuit of claim 2, wherein the first switch is a diode.

4. The artificial neuromorphic circuit of claim 3, wherein the post-neuron circuit comprises:
    a comparator configured to compare the voltage level of the capacitor and the threshold voltage to generate the firing signal;
    a delay circuit configured to delay the firing signal; and
    a pulse generator configured to generate the control signal according to the delayed firing signal.

5. An operation method of an artificial neuromorphic circuit comprising:
    providing a synapse circuit, wherein the synapse circuit comprises a first switch, a second switch, and a phase change element; the first switch comprises a first terminal and a second terminal, the second switch comprises a first terminal, a second terminal, and a control terminal, and the phase change element comprises a first terminal and a second terminal;
    providing a post-neuron circuit, wherein the post-neuron circuit comprises an input terminal and a capacitor;
    receiving a first pulse signal by using the first switch of the synapse circuit;
    receiving a second pulse signal by using the second switch of the synapse circuit;
    charging the capacitor through the input terminal by the post-neuron circuit in response to the first pulse signal;

generating a firing signal based on a voltage level of the capacitor and a threshold voltage by using the post-neuron circuit;

generating a control signal based on the firing signal by using the post-neuron circuit; and controlling a current of the second switch of the synapse circuit based on the control signal and the second pulse signal to control a state of the phase change element of the synapse circuit so as to determine a weight of the artificial neuromorphic circuit.

6. The operation method of claim 5, further comprising:

receiving the first pulse signal by using the first terminal of the first switch;

receiving the second pulse signal by using the first terminal of the second switch, wherein the second terminal of the first switch and the second terminal of the second switch are coupled to the first terminal of the phase change element; and receiving the control signal by using the control terminal of the second switch.

7. The operation method of claim 6, wherein the first switch is a diode, and the second switch is a transistor.

8. The operation method of claim 7, wherein the second terminal of the phase change element is coupled to the input terminal of the post-neuron circuit.

9. The operation method of claim 5, further comprising:

comparing the voltage level of the capacitor and the threshold voltage by using a comparator of the post-neuron circuit to generate the firing signal.

10. The operation method of claim 9, further comprising:

delaying the firing signal by using a delay circuit of the post-neuron circuit; and generating the control signal according to the delayed firing signal by using a pulse generator of the post-neuron circuit.

* * * * *